(12) United States Patent
Tonthat et al.

(10) Patent No.: US 9,924,611 B2
(45) Date of Patent: Mar. 20, 2018

(54) CONNECTORS TO SECURE MULTIPLE RAILS IN A SERVER RACK

(71) Applicant: Innovation First, Inc., Greenville, TX (US)

(72) Inventors: Hoainam James Tonthat, Greenville, TX (US); William Beene, Commerce, TX (US); James Whitney Wilson, Nevada, TX (US)

(73) Assignee: Innovation First, Inc., Greenville, TX (US)

( * ) Notice: Subject to any disclaimer, the term of this patent is extended or adjusted under 35 U.S.C. 154(b) by 0 days.

(21) Appl. No.: 14/712,957

(22) Filed: May 15, 2015

(65) Prior Publication Data

US 2016/0338217 A1 Nov. 17, 2016

(51) Int. Cl.
*A47B 96/00* (2006.01)
*H05K 7/14* (2006.01)

(52) U.S. Cl.
CPC .................................. *H05K 7/1489* (2013.01)

(58) Field of Classification Search
USPC ................................................... 248/221.12
See application file for complete search history.

(56) References Cited

U.S. PATENT DOCUMENTS

| | | | |
|---|---|---|---|
| 5,393,135 A | 2/1995 | Tisbo et al. | |
| 5,716,117 A | 2/1998 | Yu | |
| 5,902,024 A | 5/1999 | Sutherland et al. | |
| 6,021,909 A * | 2/2000 | Tang | H02B 1/36 211/183 |
| 6,227,632 B1 | 5/2001 | Liu | |
| 6,491,360 B2 | 12/2002 | Qiu | |
| 6,600,865 B2 | 7/2003 | Hwang | |
| 7,275,646 B2 * | 10/2007 | Mimlitch, III | H05K 7/186 211/26 |
| 8,757,398 B2 | 6/2014 | Letinic et al. | |
| 8,801,122 B2 | 8/2014 | Chapel et al. | |
| 2002/0195410 A1 * | 12/2002 | Lin | A47B 57/16 211/190 |
| 2005/0117309 A1 * | 6/2005 | Rieken | H05K 7/1492 361/724 |
| 2005/0286235 A1 * | 12/2005 | Randall | H05K 7/1492 361/724 |
| 2007/0131628 A1 * | 6/2007 | Mimlitch, III | A47B 47/024 211/26 |
| 2009/0261051 A1 * | 10/2009 | Dittus | H05K 7/1489 211/207 |

(Continued)

*Primary Examiner* — Monica E Millner
(74) *Attorney, Agent, or Firm* — Adam K. Sacharoff; Much Shelist, P.C.

(57) ABSTRACT

A connector assembly for securing multiple rails in a computer rack system, the rack system having at least four racks positioned on separate corners to form a front, rear and two sides of a rack frame, and wherein each rack has a plurality of rack openings. The connector assembly comprising two pair of front and rear connectors, each pair being secured to the rack frame against one of the sides defined thereby, and wherein each pair of front and rear connectors are configured to secure thereto a plurality of rails. In addition, each connector, of the front and rear connectors, includes a base plate extending from a top to a bottom, and the base plate of each connector being configured to secure to a plurality of rails.

12 Claims, 7 Drawing Sheets

(56) References Cited

U.S. PATENT DOCUMENTS

| | | | |
|---|---|---|---|
| 2010/0110621 A1* | 5/2010 | Dunn | H05K 7/1492 361/679.01 |
| 2010/0243586 A1* | 9/2010 | Henderson | H05K 7/1489 211/26.2 |
| 2012/0062083 A1* | 3/2012 | Lewis, II | H05K 7/18 312/223.1 |
| 2012/0062091 A1* | 3/2012 | Donowho | H04Q 1/062 312/351.1 |
| 2012/0063099 A1* | 3/2012 | Alaniz | H05K 7/183 361/724 |
| 2013/0342091 A1* | 12/2013 | Walker | H05K 5/0247 312/265.5 |
| 2014/0240920 A1* | 8/2014 | Cox | G06F 1/20 361/679.53 |

* cited by examiner

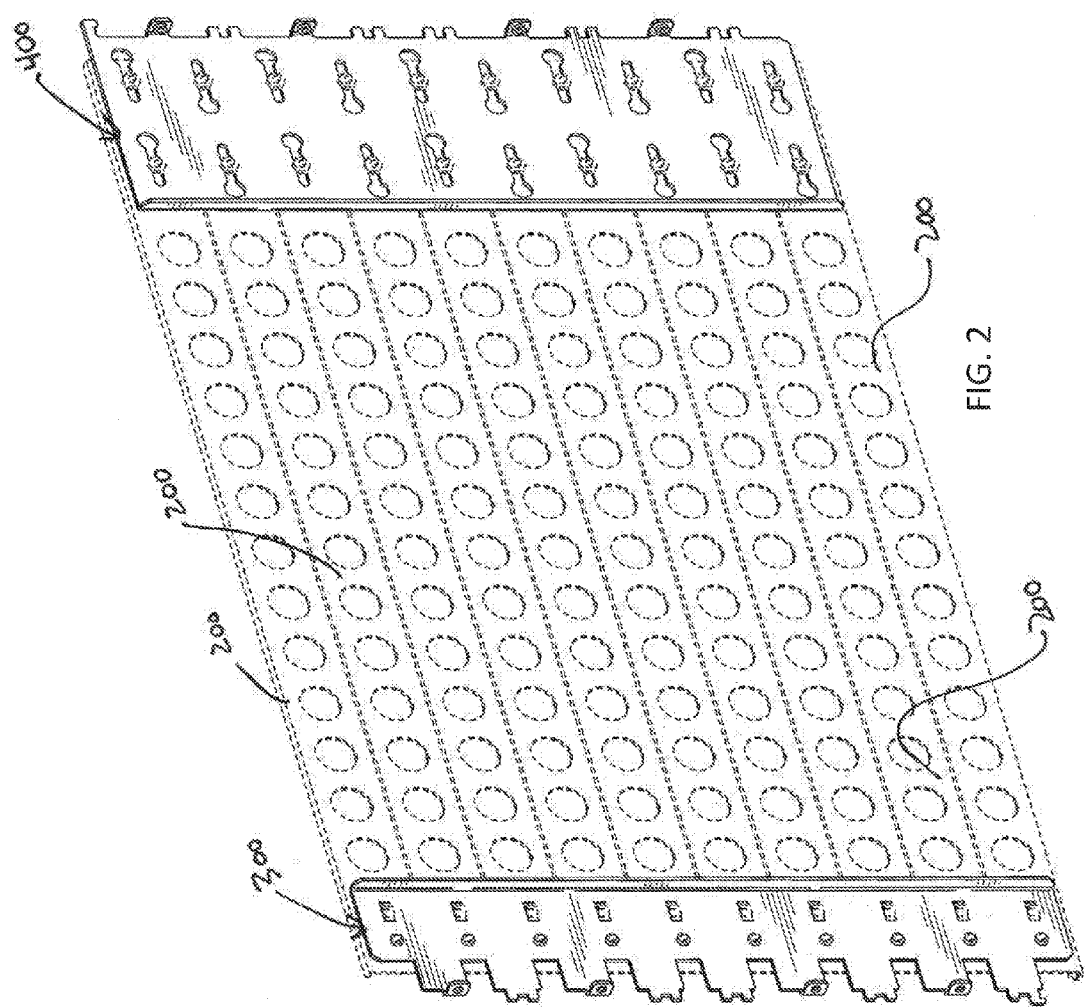

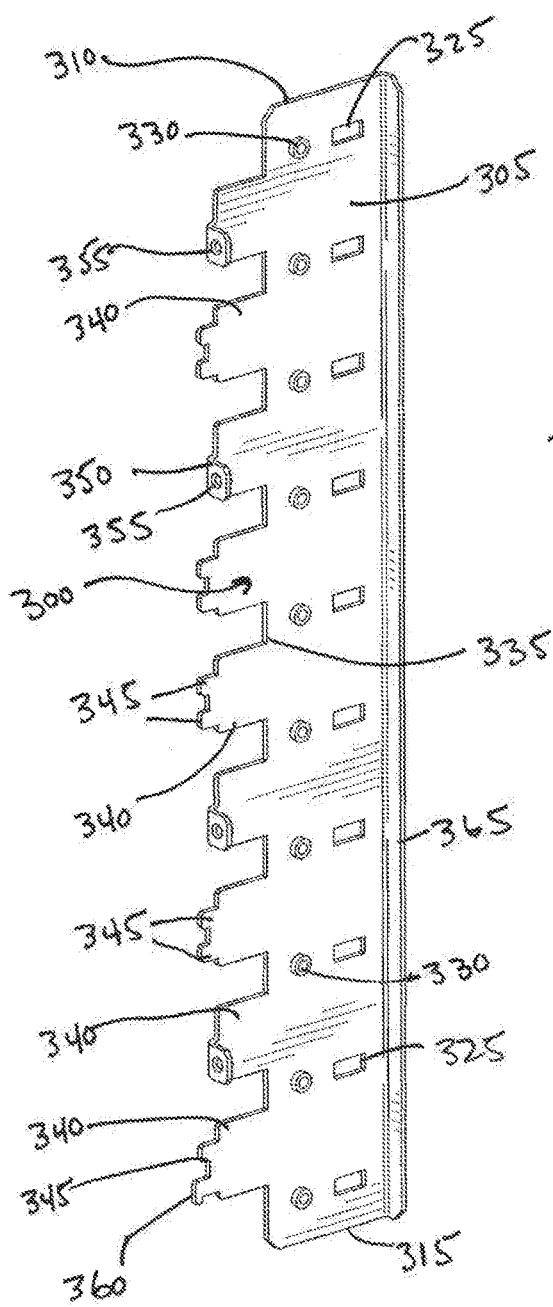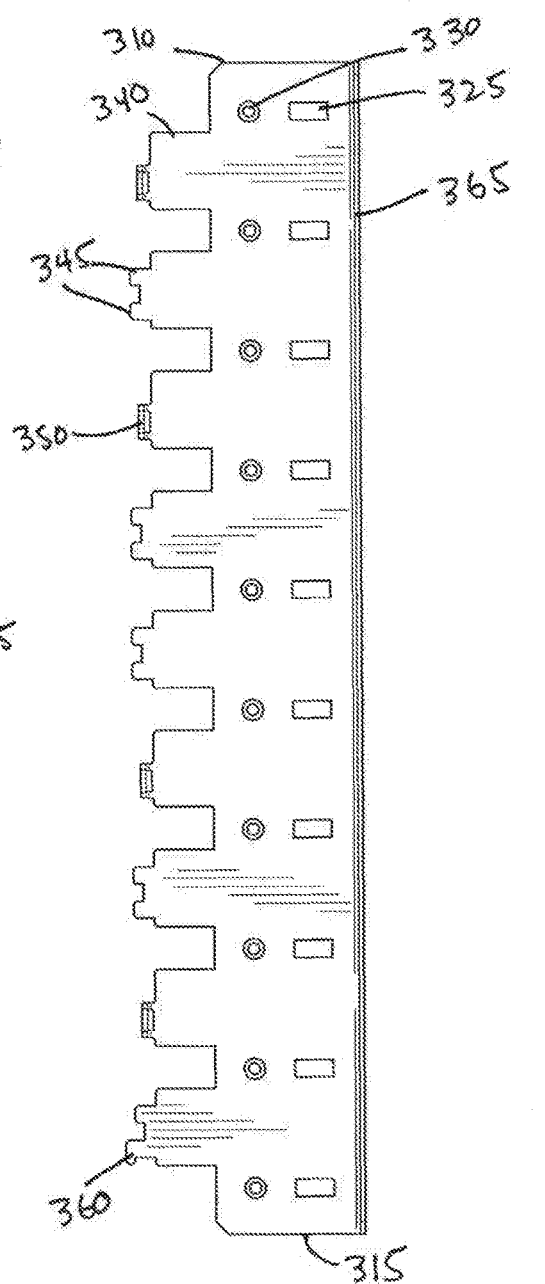
FIG. 3A
FIG. 3B

CONNECTORS TO SECURE MULTIPLE RAILS IN A SERVER RACK

TECHNICAL FIELD

The present invention relates to sliding rack-mountable rails for a rack-mounted support structure. More particularly, the invention relates to novel connectors configured to secure multiple rails together in a server rack to eliminate the need for individual connectors and to save tools and time for installing the sliding rail support structure.

BACKGROUND OF THE INVENTION

A variety of mechanical mounting structures have been devised for various structures including computer systems. In but one example, such as a server system, a number of sub-components or servers are arranged in a central cabinet or on a rack structure. The servers are typically mounted in stacked vertical arrangements, with each server being secured within the cabinet by a sliding rail structure. The sliding rail structures permit the servers to be extracted and reinserted easily into the cabinet, such as for servicing of internal components of the servers. In general, it is desirable to allow each server to be fully or nearly fully withdrawn from the cabinet in order to gain a high degree of access to internal components of the individual server. Following such service, the individual server may be closed and reinserted into the cabinet for normal operation.

Conventional server rail mounting racks include side support rails which interface with a sliding rail. The support rail is mounted to the cabinet racks on end brackets, while the sliding rail is secured to the individual servers Because the servers are often quite heavy, and, when fully extended, constitute a significant cantilevered load, the support and sliding rail structures must offer a considerable resistance to loading, while affording easy sliding motion during displacement of the server.

While sliding rail mounting structure of the type described above are generally quite effective at adequately supporting servers and other computer components, they were not without disadvantages. For example, individual end brackets must be used to mount each sliding rail to ensure the rails are adequately secured to the racks. Since the rear ends of the sliding rails are often in the back of the racks, space or access may be highly restricted preventing the user from easily installing the sliding rails or end brackets.

There is a need, therefore, for an improved technique for installing multiple computer components within a cabinet or rack. In particular, there is a need for front and rear end connectors that are configured to receive multiple sliding rail mounts. In addition, the sliding rack-mountable rails could be used in other industries to provide an easy access to cabinets or rack structures.

SUMMARY OF THE INVENTION

In accordance with various aspects of the invention, there is provided a connector assembly for securing multiple rails in a computer rack system. The rack system has at least four racks positioned on separate corners to form a front, rear and two sides of a rack frame, and each rack has a plurality of rack openings. The connector assembly includes two pair of front and rear connectors. Each pair is secured to the rack frame against one of the sides defined thereby. Each pair of front and rear connectors are also configured to secure to a plurality of rails. Each connector, of the front and rear connectors, further includes a base plate extending from a top edge to a bottom edge. The base plate of each connector is configured to secure to a plurality of rails, and the base plate of each connector further includes a rear face that abuts the plurality of rails.

Each front connector may also include a plurality of apertures and a plurality of slots positioned on the base plate and spaced along the base plate from the top edge to the bottom edge. The plurality of apertures and plurality of slots are configured to receive clips and fasteners defined on the rails to secure the rails to the front connector. Each front connector may also include a front edge. The front edge has defined thereon a plurality of flanges extending forwardly from the front edge. The plurality of flanges alternate to include finger clips extending therefrom or a locking plate with a locking plate opening. The finger clips are spaced to slide into engagement with the rack openings on the front of the rack frame and/or the locking plate is spaced to receive a fastener through the rack opening and into the locking plate opening. As further defined herein, one or more of the finger clips may include a portion extending downwardly to secure the front connector against the front of the rack frame. The front connector may also include a rear edge opposite the front edge, the rear edge further includes a portion curved from the side base plate and away from the rails such that the rear edge may be gripped during attachment to the rails and the front of the rack frame.

Each rear connector may be further configured to include a plurality of key slots positioned on the base plate and spaced along the base plate from the top edge to the bottom edge. The plurality of key slots are configured to receive fastener heads defined to extend from the rails to secure the rails to the rear connector. Each rear connector further includes a rear edge, the rear edge includes a plurality of finger clips extending therefrom and a plurality of locking plates with a locking plate opening, wherein the finger clips are spaced to slide into engagement with the rack openings on the rear of the rack frame and/or the locking plate is spaced to receive a fastener through the rack opening and into the locking plate opening. In addition, one or more of the finger clips may include a portion extending downwardly to secure the rear connector against the rear of the rack frame. The rear connector may also include a front edge opposite the rear edge, the front edge further includes a portion curved from the side base plate and away from the rails such that the front edge may be gripped during attachment to the rails and the rear of the rack frame.

Numerous other advantages and features of the invention will become readily apparent from the following detailed description of the invention and the embodiments thereof, from the claims, and from the accompanying drawings.

DESCRIPTION OF DRAWINGS

A fuller understanding of the foregoing may be had by reference to the accompanying drawings, wherein:

FIG. 2 is a perspective view of the front and rear connectors in accordance with one embodiment of the present invention;

FIGS. 3A-3C are illustrations of the front connector in accordance with one embodiment of the present invention.

DETAILED DESCRIPTION OF THE EMBODIMENTS

Figure 1A:
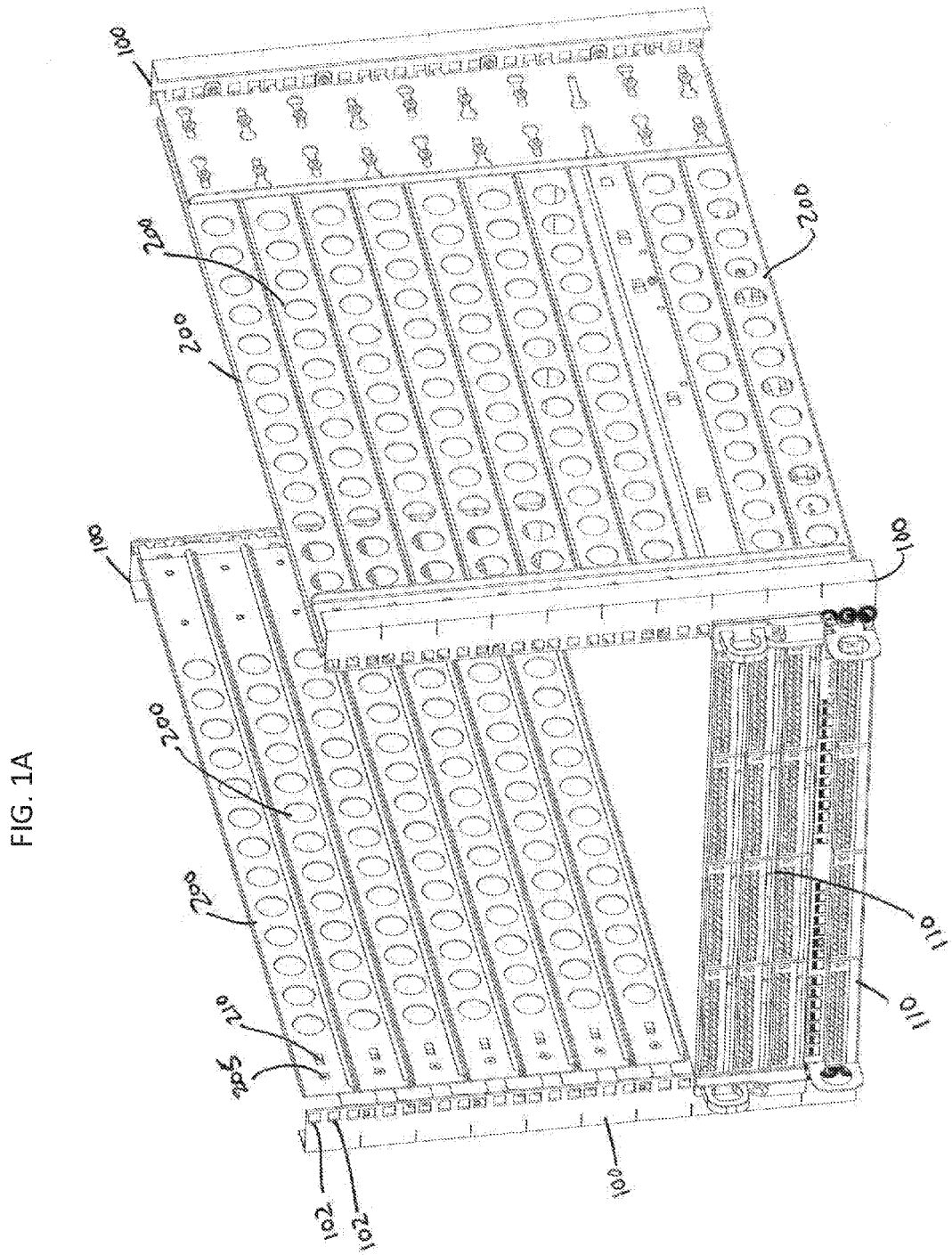
FIG. 1A is a front perspective view of a server secured to a rack shelf using sliding rails and front and rear multi-connectors in accordance with one embodiment of the present invention.

While the invention is susceptible to embodiments in many different forms, there are shown in the drawings and will be described in detail herein the preferred embodiments of the present invention. It should be understood, however, that the present disclosure is to be considered an exemplification of the principles of the invention and is not intended to limit the spirit or scope of the invention and/or claims of the embodiments illustrated.

Various embodiments of the principles of the present invention are shown in FIGS. 1A-H. The present invention comprises front and rear connectors for electronic and related components to be supported in rack systems of various configurations. The connectors of the present invention are configured to support multiple rails that are adapted/configured for use with computer equipment, such as servers and other electronic components. The rails and its connection to the computer equipment are known in the industry.

Figure 1B:
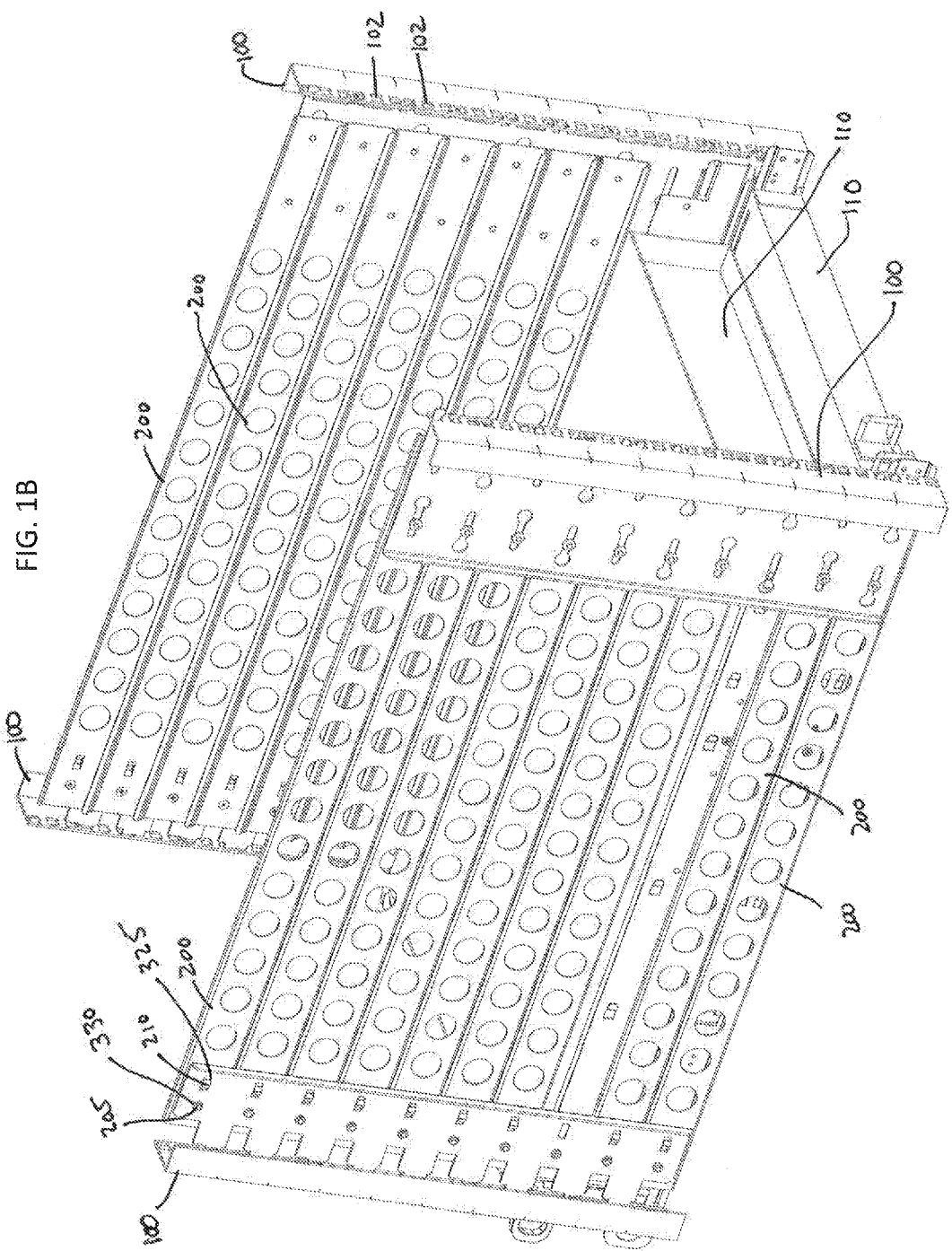
FIG. 1B is a rear perspective view of FIG. 1A.

As illustrated in FIGS. 1A and 1B, corner racks 100 that extend vertically and that are designed to support servers 110 or electronic and related components are provided in its normal industry configuration. The racks 100 include openings 102 spaced along the length of the racks 100 to receive and secure end brackets (not shown) that are typically configured to connect to with side rails 200. The rails 200 include a counterpart that is attached to the support servers 110 and thus allow the support servers to slide in and out of the racks 100. However, rather than use multiple end brackets that cost money and time to install and which may be difficult to install depending on the pre-existing services that are already attached, the present invention is directed to solve these on-going issues and problems in the industry.

As illustrated in FIG. 2, multiple, more than one, rails 200 can be pre-attached to front and rear connectors 300 and 400, respectively. prior to being connected or secured to the racks 100. The front and rear connectors 300 and 400 are shown and described separately herein.

Figure 3C:
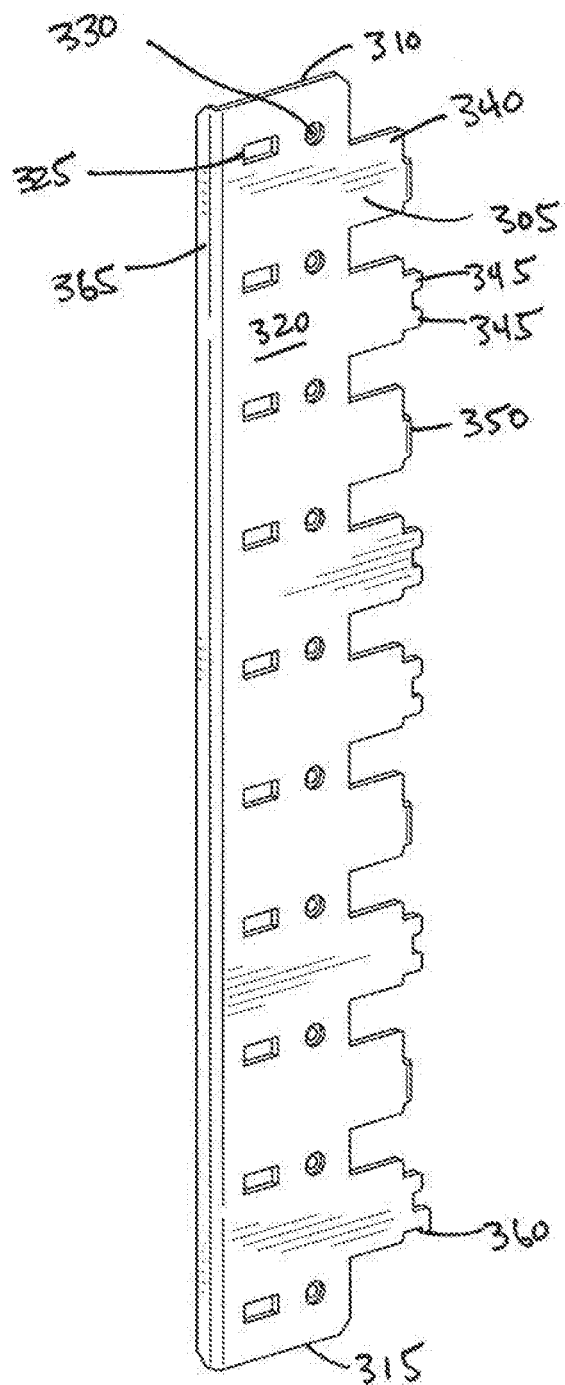

Referring now to FIGS. 3A through 3C there is shown a front connector 300 in accordance with one or more embodiments of the present invention. The front connector 300 includes a side base plate 305 extending from a top edge 310 to a bottom edge 315. The side base plate 305 includes a rear face 320 that abuts the side rails 200. The side base plate 305 further includes a plurality of slots 325 and a plurality of apertures 330 extending along the side base plate 305 and configured to receive clips 205 and fasteners 210 from the rails 200 in order to secure the rails to the front connector 300. The side base plate 305 includes a front edge 335 that includes a plurality of flanges 340 extending forwardly from the front edge 335. The flanges 340 having alternating finger clips 345 extending therefrom or a locking plate 350 with an opening 355. The finger clips 345 are spaced such that they slide into the rack openings 102 on the rack 100. Alternatively, a fastener can be inserted through the rack opening 102 and secure through the locking plate opening 355 to secure the front connector 300 to the rack 100. Since the rack openings 102 are spaced apart by a predefined distance, the finger clips 345 are similarly spaced. In addition, the finger clips 345 positioned towards the bottom edge and/or upper edge may include a downwardly extending finger flange 360 to further help secure the front connector 300 against the rack 100. Lastly, opposite the front edge 335 is a rear edge 365 turned or curved away from the side base plate 305 and away from the connection to the rails 200. The rear edge 365 is configured to aid the user in gripping and holding the front connector 300 during attachment.

Figure 4A:
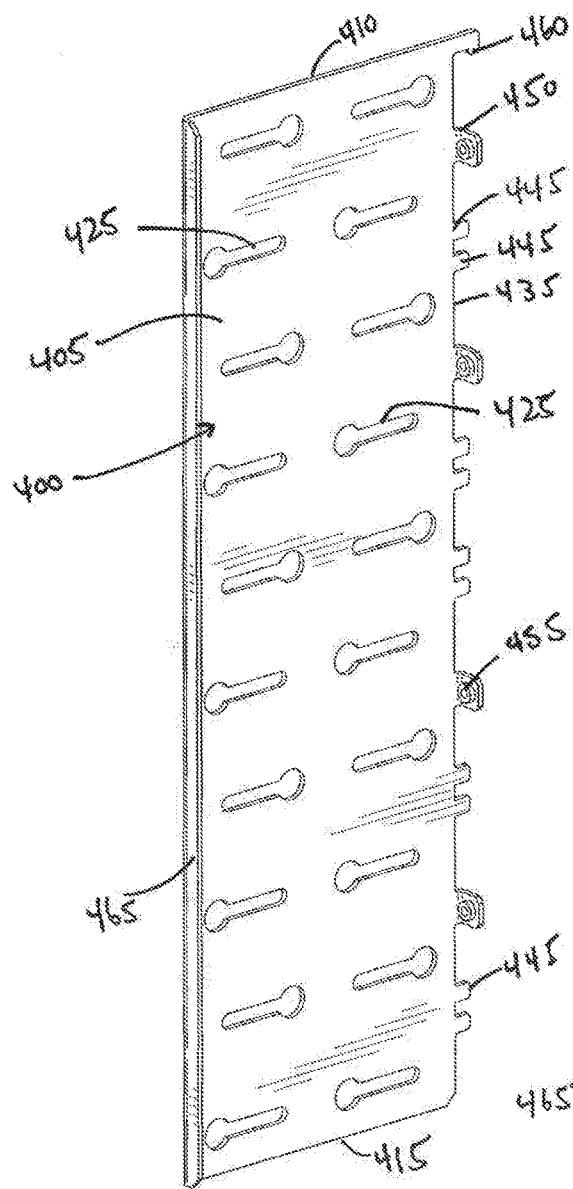
FIGS. 4A-4C are illustrations of the rear connector in accordance with one embodiment of the present invention.
Figure 4B:
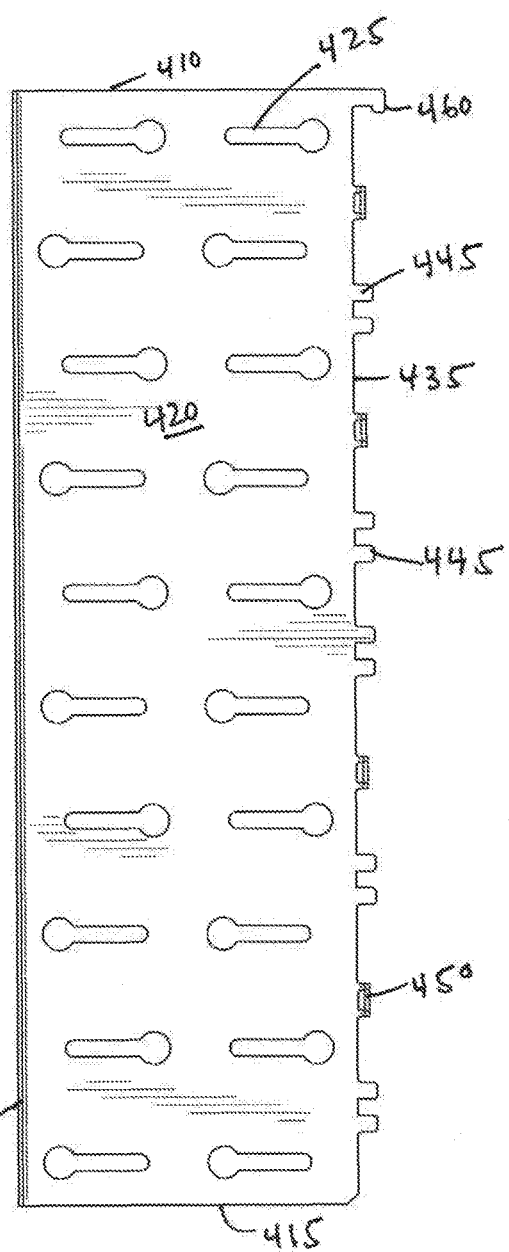
Figure 4C:
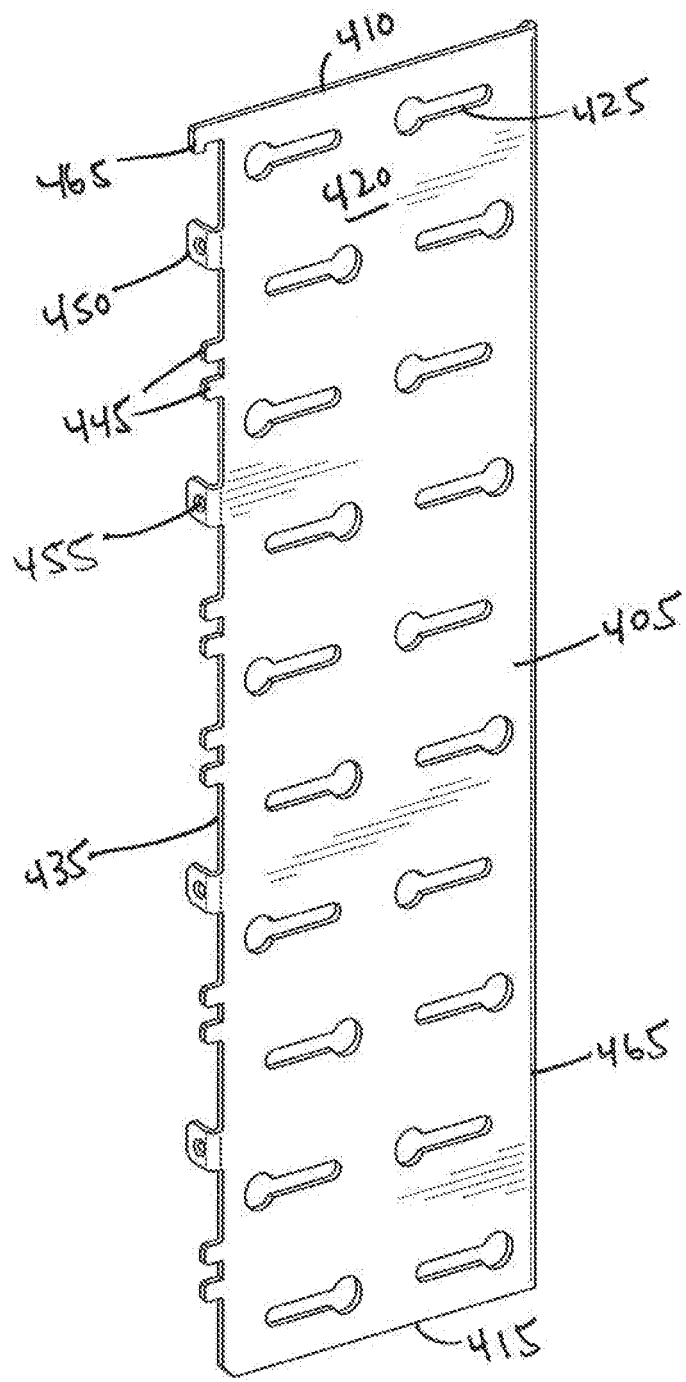

Referring now to FIGS. 4A through 4C there is shown a rear connector 400 in accordance with one or more embodiments of the present invention. The rear connector 400 includes a side base plate 405 extending from a top edge 410 to a bottom edge 415. The side base plate 405 includes a rear face 420 that abuts the side rails 400. The side base plate 405 further includes a plurality of pairs of key slots 425 extending along the side base plate 405 and configured to receive fastener, heads 220 from the rails 200 in order to secure the rails to the rear connector 400. The side base plate 405 includes a rear edge 435 that includes a plurality of finger clips 445 extending therefrom or a locking plate 450 with an opening 455. The finger clips 445 are spaced such that they slide into the rack openings 102 on the rack 100. Alternatively, a fastener can be inserted through the rack opening 102 and secure through the locking plate opening 455 to secure the rear connector 300 to the rack 100. Since the rack openings 102 are spaced apart by a predefined distance, the finger clips 445 are similarly spaced. In addition, the finger clips 445 positioned towards the upper edge and/or lower edge may include a, downwardly extending finger flange 460 to further help secure the rear connector 400 against the rack 100. Lastly, opposite the rear edge 435 is a front edge 465 curved or turned away from the side base plate 405 and away from the connection to the rails 200. The front edge 465 is configured to aid the user in gripping and holding the rear connector 400 during attachment.

From the foregoing and as mentioned above, it is observed that numerous variations and modifications may be effected without departing from the spirit and scope of the novel concept of the invention. It is to be understood that no limitation with respect to the embodiments illustrated herein is intended or should be inferred. It is intended to cover, by the appended claims, all such modifications within the scope of the appended claims.

We claim:

1. A connector assembly for securing a plurality of pairs of rails in a computer rack system, the rack system having at least four racks positioned on separate corners to form a front, rear and two sides of a rack frame, and wherein each rack has a plurality of rack openings, the connector assembly comprising:

two pair of front and rear connectors, each pair of the two pair of front and rear connectors being secured to the rack frame against one of the two sides defined thereby, and wherein each pair of the two pair of front and rear connectors are configured to secure thereto the plurality of pairs of rails, and wherein each connector, of the front and rear connectors, includes a base plate extending from a top edge to a bottom edge, the base plate of each connector being configured to secure to the plurality of pairs of rails, and the base plate of each connector further including a rear face that abuts the plurality of pairs of rails, and wherein each front connector is further configured to include a plurality of apertures and a plurality of slots positioned on the base plate and spaced along the base plate from the top edge to the bottom edge, the plurality of apertures and plurality of slots being configured to receive clips and fasteners defined on the plurality of pairs of rails to secure plurality of pairs of rails to each front connector, and wherein each front connector further includes a front edge, the front edge includes a plurality of flanges extending forwardly from the front edge, and wherein the plurality of flanges alternate to include finger clips extending therefrom or a locking plate with a locking plate opening, wherein the finger clips are spaced to slide into engagement with the rack openings on the front of the rack frame and/or the locking plate is spaced to receive a fastener through the rack opening and into the locking plate opening.

2. The connector assembly of claim 1, wherein one or more of the finger clips further includes a portion extending downwardly.

3. The connector assembly of claim 1, wherein each front connector further includes a rear edge opposite the front edge, the rear edge further includes a portion curved from the base plate and away from the plurality of pairs of rails such that the rear edge may be gripped during attachment to the plurality of pairs of rails and the front of the rack frame.

4. A connector assembly for securing a plurality of pairs of rails in a computer rack system, the rack system having at least four racks positioned on separate corners to form a front, rear and two sides of a rack frame, and wherein each rack has a plurality of rack openings, the connector assembly comprising:
two pair of front and rear connectors, each pair of the two pair of front and rear connectors being secured to the rack frame against one of the two sides defined thereby, and wherein each pair of the two pair of front and rear connectors are configured to secure thereto the plurality of pairs of rails, and
wherein each connector, of the front and rear connectors, includes a base plate extending from a top edge to a bottom edge, the base plate of each connector being configured to secure to the plurality of pairs of rails, and the base plate of each connector further including a rear face that abuts the plurality of pairs of rails, and
wherein each rear connector is further configured to include a plurality of key slots positioned on the base plate and spaced along the base plate from the top edge to the bottom edge, the plurality of key slots being configured to receive fastener heads defined to extend from the plurality of pairs of rails, and
wherein each rear connector further includes a rear edge, the rear edge includes a plurality of finger clips extending therefrom and a plurality of locking plates with a locking plate opening, wherein the finger clips are spaced to slide into engagement with the rack openings on the rear of the rack frame and/or the locking plate is spaced to receive a fastener through the rack opening and into the locking plate opening.

5. The connector assembly of claim 4, wherein one or more of the finger clips further includes a portion extending downwardly to secure the rear connector against the rear of the rack frame.

6. The connector assembly of claim 4, wherein each rear connector further includes a front edge opposite the rear edge, the front edge further includes a portion curved from the base plate and away from the plurality of pairs of rails such that the front edge may be gripped during attachment to the plurality of pairs of rails and the rear of the rack frame.

7. A front connector for securing a plurality of pairs of rails in a computer rack system, the rack system having at least four racks positioned on separate corners to form a front, rear and two sides of a rack frame, and wherein each rack has a plurality of rack openings, the front connector comprising:
a base plate extending from a top edge to a bottom edge, the base plate being configured to secure to a plurality of rails, and the base plate of each connector further including a rear face that abuts the plurality of rails; and
a plurality of apertures and a plurality of slots positioned on the base plate and spaced along the base plate from the top edge to the bottom edge, the plurality of apertures and plurality of slots being configured to receive clips and fasteners defined on each of the rails, of the plurality of pairs of rails, to secure the plurality of pairs of rails to the front connector; and
a front edge, the front edge includes a plurality of flanges extending forwardly from the front edge, and wherein the plurality of flanges alternate to include finger clips extending therefrom or a locking plate with a locking plate opening, wherein the finger clips are spaced to slide into engagement with the rack openings on the front of the rack frame and/or the locking plate is spaced to receive a fastener through the rack opening and into the locking plate opening.

8. The front connector of claim 7, wherein one or more of the finger clips further includes a portion extending downwardly.

9. The front connector of claim 8 further including a rear edge opposite the front edge, the rear edge further includes a portion curved from the side base plate and away from the rails such that the rear edge may be gripped during attachment to the rails and the front of the rack frame.

10. A rear connector for securing multiple rails in a computer rack system, the rack system having at least four racks positioned on separate corners to form a front, rear and two sides of a rack frame, and wherein each rack has a plurality of rack openings, the rear connector comprising:
a base plate extending from a top edge to a bottom edge, the base plate being configured to secure to a plurality of rails, and the base plate of each connector further including a rear face that abuts the plurality of rails;
a plurality of apertures and a plurality of slots positioned on the base plate and spaced along the base plate from the top edge to the bottom edge, the plurality of apertures and plurality of slots being configured to receive clips and fasteners defined on the rails to secure the rails to the rear connector;
a plurality of key slots positioned on the base plate and spaced along the base plate from the top edge to the bottom edge, the plurality of key slots being configured to receive fastener heads defined to extend from the rails to secure the rails to the rear connector; and
a rear edge, the rear edge includes a plurality of finger clips extending therefrom and a plurality of locking plates with a locking plate opening, wherein the finger clips are spaced to slide into engagement with the rack openings on the rear of the rack frame and/or the locking plate is spaced to receive a fastener through the rack opening and into the locking plate opening.

11. The rear connector claim 10, wherein one or more of the finger clips further includes a portion extending downwardly to secure the rear connector against the rear of the rack frame.

12. The rear connector claim 11 further including a front edge opposite the rear edge, the front edge further includes a portion curved from the base plate and away from the rails such that the front edge may be gripped during attachment to the rails and the rear of the rack frame.

\* \* \* \* \*